United States Patent [19]

Ilani

[11] Patent Number: 5,781,021
[45] Date of Patent: Jul. 14, 1998

[54] UNIVERSAL FIXTURELESS TEST EQUIPMENT

[75] Inventor: Avner Ilani, Kiron, Israel

[73] Assignee: Key Solutions Ltd., Kiron, Israel

[21] Appl. No.: 740,514

[22] Filed: Oct. 30, 1996

Related U.S. Application Data

[63] Continuation-in-part of Ser. No. 370,067, Jan. 9, 1995, Pat. No. 5,633,596.

[30] Foreign Application Priority Data

| Jan. 11, 1994 | [IL] | Israel | 107550/2 |
| Jan. 11, 1994 | [IL] | Israel | 107550/3 |
| Aug. 24, 1994 | [IL] | Israel | 107550/4 |

[51] Int. Cl.$^6$ .................................................. G01R 31/02
[52] U.S. Cl. ........................................ 324/754; 324/765
[58] Field of Search ............................. 324/754, 765, 324/755, 758, 761

[56] References Cited

U.S. PATENT DOCUMENTS

| 4,587,481 | 5/1986 | Lischke et al. | 324/72.5 |
| 4,929,893 | 5/1990 | Sato et al. | 324/758 |
| 4,966,520 | 10/1990 | Yokota et al. | 414/786 |
| 5,012,780 | 5/1991 | Littlebury | 324/754 |
| 5,055,780 | 10/1991 | Takagi et al. | 324/754 |
| 5,070,297 | 12/1991 | Kwon et al. | 324/754 |
| 5,198,757 | 3/1993 | Azumai | 324/754 |
| 5,363,038 | 11/1994 | Love | 324/158.1 |
| 5,497,079 | 3/1996 | Yamada et al. | 324/158.1 |
| 5,506,510 | 4/1996 | Blumenau | 324/754 |
| 5,532,610 | 7/1996 | Tsujide et al. | 324/754 |

*Primary Examiner*—Ernest F. Karlsen
*Assistant Examiner*—Anh Phung
*Attorney, Agent, or Firm*—Mark M. Friedman

[57] ABSTRACT

A universal, fixtureless automatic test equipment is provided, capable of accessing opposite surfaces of any workpiece, simultaneously, for functionality testing. The workpiece can be freely placed anywhere on the test area, regardless of orientation, without the need for pre-test registration, alignment, or any kind of securing means. The test area of a universal fixtureless automatic test equipment, according to the teachings of the present invention, is made up of Independent Test Modules (ITMs). A test area may be configured from any number of ITMs, as desired. The ITMs can be individually selected for testing various functions of a respective section of a workpiece under test, and for independent electrical functioning. A typical ITM is made up of a plurality of semiconductor dies. Dies are similarly structured with matrices of selectable memorized bidirectional switching cells. Each switching cell is connected to a terminal-pad on the surface of the die. The terminal-pads extend to a test mattress of highly dense, compressible micronic bumps by means of a Adapter/Pitch Translator. These bumps function as independent test electrodes and are dimensioned to provide two positive features: to guarantee that each tested element on a workpiece corresponds with at least two of the test electrodes, and that the test electrodes are dimensioned to prevent shortages between adjacent pairs of tested elements.

21 Claims, 7 Drawing Sheets

UNIVERSAL FIXTURELESS TEST EQUIPMENT

This is a Continuation in Part of U.S. patent application Ser. No. 08/370,067, filed Jan. 9, 1995, now U.S. Pat. No. 5,633,596.

FIELD AND BACKGROUND OF THE INVENTION

The present invention relates to automatic test equipment for testing the functionality of electronic workpieces.

Bare workpieces are commonly tested with a variety of automatic test equipment which verify different aspects of functionality such as continuity, insulation resistance, detection of undesirable opens and shorts, improper connections, etc. Generally speaking, automatic test equipment can be classified as follows: Automatic Optical Inspection (AOI) systems for inspecting inner layers of workpieces and Ohmic test systems for the final testing of a manufactured workpiece. In other words, the AOI systems and the Ohmic test systems complement one another in the testing of workpieces.

Ohmic test systems can be generally divided into two types of systems: bed of nails systems or flying probe systems.

Bed of nails systems typically employ bulky fixtures with either rigid metallic probes or spring-loaded, gold-plated probes. In both cases, the systems require high static pressure to ensure reliable contact between the probes and test points on the workpiece. Such systems suffer from a number of disadvantages. First, the rigid metallic probes, and even the delicate spring-loaded probes, often leave witness marks, such as notches and cavities, due to the high static pressure which may, in turn, cause a high rejection rate due to the necessity for compliance with strict standards. Second, the high static pressure frequently causes false shorts between adjacent probes especially when the tested board is crowded with fine-pitch shapes. Third, when expensive standard fixtures are not used, each workpiece requires a dedicated fixture which imposes a considerable burden on the total manufacturing cost of workpieces, especially in the case of small lots or prototypes. Fourth, test points are sometimes deleted because their locations are difficult or expensive to probe and therefore, in many cases, fixtures do not provide full coverage of a workpiece. Fifth, single terminal nets, such as fiducials cannot be tested by single probe contact. Sixth, the test switching process is done using a large number of plug-in switch cards which reside remote from the test probes, thereby requiring complex electrical cabling.

In Circuit Test (ICT) machines currently employed for testing populated workpieces, require a bed of nails designed specifically for testing a paritcular workpiece. Moreover, any modification to the original design of the populated workpiece requires reconfiguring the bed of nails.

Flying probe systems employ probes displaceable along the X and Y axes. These systems suffer from the disadvantages that they can only cope with modest-sized lots due to their poor throughput and that moving parts are well known in the industry for their frequent problems.

The technological limits of performance of Automatic Test Equipment (ATE) and ICT known in the art for testing electronic devices carriers had peaked while leaving major technical and test problems unsolved. Such traditional ATEs and ICTs cannot cope with new problems resulting from the great strides with which the concerned technologies are advancing. There is therefore a need for automatic test equipment for verifying different aspects of workpieces which overcome the disadvantages of the existing automatic test equipment and enables remarkably efficient test methods.

SUMMARY OF THE INVENTION

The present invention is of a universal, fixtureless test equipment for testing workpieces placed at any orientation upon the test equipment without any physical adjustment of either the workpiece or the test equipment. The present invention also teaches a method for performing a logical registration for a workpiece placed on a test mattress and novel test and measurement methods enabled by the test equipment of the present invention.

The term "universal" is meant to indicate that the same test equipment is capable of testing any given workpiece without first modifying the test equipment. The term "fixtureless" is meant to indicate that the test equipment does not require any kind of physical adjustment or setup preparation prior to testing a workpiece. Specifically, no hardware modification or setup preparation such as registration, alignment, fixturing, receiving, guiding, engaging, holding and securing a workpiece for test are needed, nor are respective connection or matching. The term "element" is realized as any elementary conductive metallic area as a terminal on a workpiece, regardless of whether the terminal resides on the surface or an internal layer, as is the case with multi-layer workpieces. Terminals include floating terminals, such as fiducials, mechanical holes, unconnected shielding planes, and also functional conductive areas, such as power plans, testpoints, plated through pads and surface mound pads (SMD). Pads of components operate in two modes: active pads carry a signal, and passive pads which are unused fanout pads. The term "workpiece" is realized as printed wiring board (PWB), both populated and unpopulated, and as electronic component carriers of any type. Thus, they include, but are not limited to, rigid PWBs, flex PWBs, and flex-rigid PWBs. Also, the workpiece may be realized as being in any stage of fabrication: in-process, at the final Q.A., and at the pre-assembly and post-assembly stages of production.

Thus, according to the teachings of the present invention there is provided a universal, fixtureless automatic test equipment for testing the functionality of any workpiece. One embodiment of such a test equipment features at least one Independent Test Module (ITM). A typical ITM is presently described. It is made up of a plurality of flipped ASIC dies. A typical die includes a matrix of bi-directional memorized switching cells, independently selectable. A typical die is surfaced by an array of terminal-pads, one for every switching cell. Employing Flip Chip Technology (FpC), the dies are flipped and mounted on an Adapter/Pitch-Translator (APT), so that the surface with the terminal-pad array faces the APT. The APT mechanically supports the delicate dies and extends their terminal pads with individual leads ended with bumps, in order to create test electrodes. This entire element is called an ITM, and provides a mattress with a high density of test electrodes. Accordingly, the mattress guarantees that each element of the workpiece will be touched by at least one electrode of the mattress. The ITM further includes a protective rigid housing to mechanically support the adapter on which the dies are arranged in a floating manner. There are air gaps in the surrounding and above each die such that the dies are not affected by physical pressure exerted on the ITM during the test.

According to further features in preferred embodiments of the invention described below, the test electrodes are arranged in a density that guarantees that each tested element of the workpiece will be touched by at least two electrodes of the mattress.

According to still further features in preferred embodiments of the invention described below, the test equipment further features an adapter connected to the semiconductor devices. According to this embodiment, the mattress is the outer surface of the adapter. According to further features in this preferred embodiment, the adapter is realized as a pitch translator for adjusting the density of electrodes on the mattress. According to still other features in this preferred embodiment the adapter extends vertically.

According to still further features in preferred embodiments of the invention, a compressible layer is situated between the protective layer and the supporting base plate, in order to accommodate height variations on the surface of a tested element.

According to further features in preferred embodiments of the invention described below, the test electrodes are configured as bumps. According to further features in this preferred embodiment, the bumps are fabricated using the Precise Printing process. According to still further features in this preferred embodiment of the invention described below, the test electrodes are configured as elastomeric bumps.

According to further features in preferred embodiments of the invention described below, the semiconductors are fabricated using the Precise Printing process.

According to further features in preferred embodiments of the invention described below, the test electrodes are made up on electrically conductive cushion.

According to further features in preferred embodiments of the invention described below, the switching cells are bi-directional.

According to further features in preferred embodiments of the invention described below, the test equipment features a plurality of test modules, each of which functions independently electrically.

According to further features in preferred embodiments of the invention described below, the test equipment features a plurality of test modules, each of which functions independently mechanically.

According to further features in preferred embodiments of the invention described below, the semiconductor devices are adjacent to a workpiece under test.

Yet another embodiment of an automatic test equipment for testing the functionality of any workpiece placed in any position upon the equipment, features a mattress of test electrodes, a plurality of semiconductor devices featuring flip chip technology, and software for testing the workpiece without physical registration. As in the first embodiment the test mattress features a high density of test electrodes, thus guaranteeing that each element of the workpiece will be touched by at least one electrode of the mattress. According to further features in the present embodiment of the invention, the test mattress guarantees that each tested element of the workpiece will be touched by at least two electrodes.

According to the teachings of the present invention, there is also provided a method for registration between a test mattress of an automatic test equipment and a workpiece under test. The method features the following steps:

(a) providing a reference point of the test mattress;

(b) providing a reference file of the workpiece. This reference file includes X and Y co-ordinates of the elements of the workpiece relative to a reference point of the workpiece;

(c) determining an X-offset of the workpiece relative to the reference point of the test mattress;

(d) determining a Y-offset of the workpiece relative to the reference point of the test mattress;

(e) determining a placement angle of the workpiece relative to the test mattress;

(f) updating the X and Y co-ordinates of the elements of the workpiece in the reference file of the workpiece such that the X and Y co-ordinates are relative to the reference point of the test mattress; and (g) testing the workpiece using the updated reference file of step (f), without any physical adjustment of either the workpiece or the test equipment.

According to the teachings of the present invention, there is further provided a method for exerting a minimum of pressure on a workpiece during testing, the method involves the following steps:

(a) providing a mattress of test electrodes. The electrodes are arranged at a density such that at least two of the electrodes touch each of the elements of the workpiece to be tested;

(b) contacting the mattress with the workpiece;

(c) incrementing the contact pressure between the workpiece and the test electrodes;

(d) detecting an electrical continuity between the at least two electrodes; and (e) when the detection of step (d) occurs, ceasing the incrementing of step (c).

According to the teachings of the present invention, there is further provided a method for identifying a single element net (also known as a floating conductive element) in a workpiece. The method is made up of the following steps:

(a) providing position coordinates for the single element net;

(b) contacting at least two test electrodes with the workpiece at the position described by the coordinates;

(c) sending an electronic signal through one of the test electrodes; and (d) detecting the signal of step (c) on other of the at least two test electrodes.

According to the teachings of the present invention, there is further provided a method for testing a multiple element net on a workpiece. A multiple element net is a net connecting more than two terminals. The method involves the steps of:

(a) providing a workpiece featuring a multiple element net;

(b) providing test electrodes contacting each element of the multiple element net, respectively;

(c) sending a test signal via one of the electrodes to one of the elements as input;

(d) simultaneously detecting the signal of step (c) as output at all of the other elements.

According to still further features in preferred embodiments of the invention, the method involves executing the above-mentioned test on a plurality of multiple element nets, simultaneously.

According to the teachings of the present invention there is further provided a method for measuring impedance and resistance of a conductive line in a workpiece, the method comprising:

(a) providing a plurality of test electrodes;

(b) contacting one end of the conductive line with at least two of the plurality of test electrodes;

(c) contacting the other end of the conductive line with at least one of the plurality of test electrodes, said contact of the other end forming a plurality of electrical test circuits;

(d) measuring impedance and/or resistance on each of the test circuits of step (c); and (e) calculating the impedance and/or resistance of the conductive line using the measurements of step (d).

According to the teachings of the present invention there is further provided an integrated circuit package situated on a workpiece facilitating testing of the package with an In Circuit Test equipment (ICT). The package features a contact surface with the workpiece. The package also features fanout terminals and a conductive filament connected to each of the fanout terminals. The conductive filament extends beyond an outer surface of the integrated circuit package opposite the contact surface with the workpiece. The outer surface is thus defined as the surface opposite the surface which contacts the workpiece. In this way, the populated workpiece under test can be engaged with the ITM without the need for dedicated testpoints.

BRIEF DESCRIPTION OF THE DRAWINGS

The invention is herein described, by way of example only, with reference to the accompanying drawings, wherein:

FIG. 5b is a close-up view of a switching cell of the semiconductor die of FIG. 5a;

DESCRIPTION OF THE PREFERRED EMBODIMENTS

The present invention is of a universal test equipment for testing any workpiece regardless of the architecture of the workpiece and without any need for prior adjustments or alignment of the workpiece or of the test equipment.

The principles and operation of a universal test equipment according to the present invention may be better understood with reference to the drawings and the accompanying description.

In order to provide a truly universal fixtureless testing device capable of testing any workpiece without regard for the architecture of the tested workpiece, the universal fixtureless automatic test equipment provides a continuous, uniform, dense array of micronic test electrodes. In order to provide the necessary density of such electrodes, the present invention uses semiconductor dies featuring a multitude of terminals for testing, while employing Flip Chip technology (FpC), according to which, all I/O terminals are placed on one surface of the die.

Figure 1:
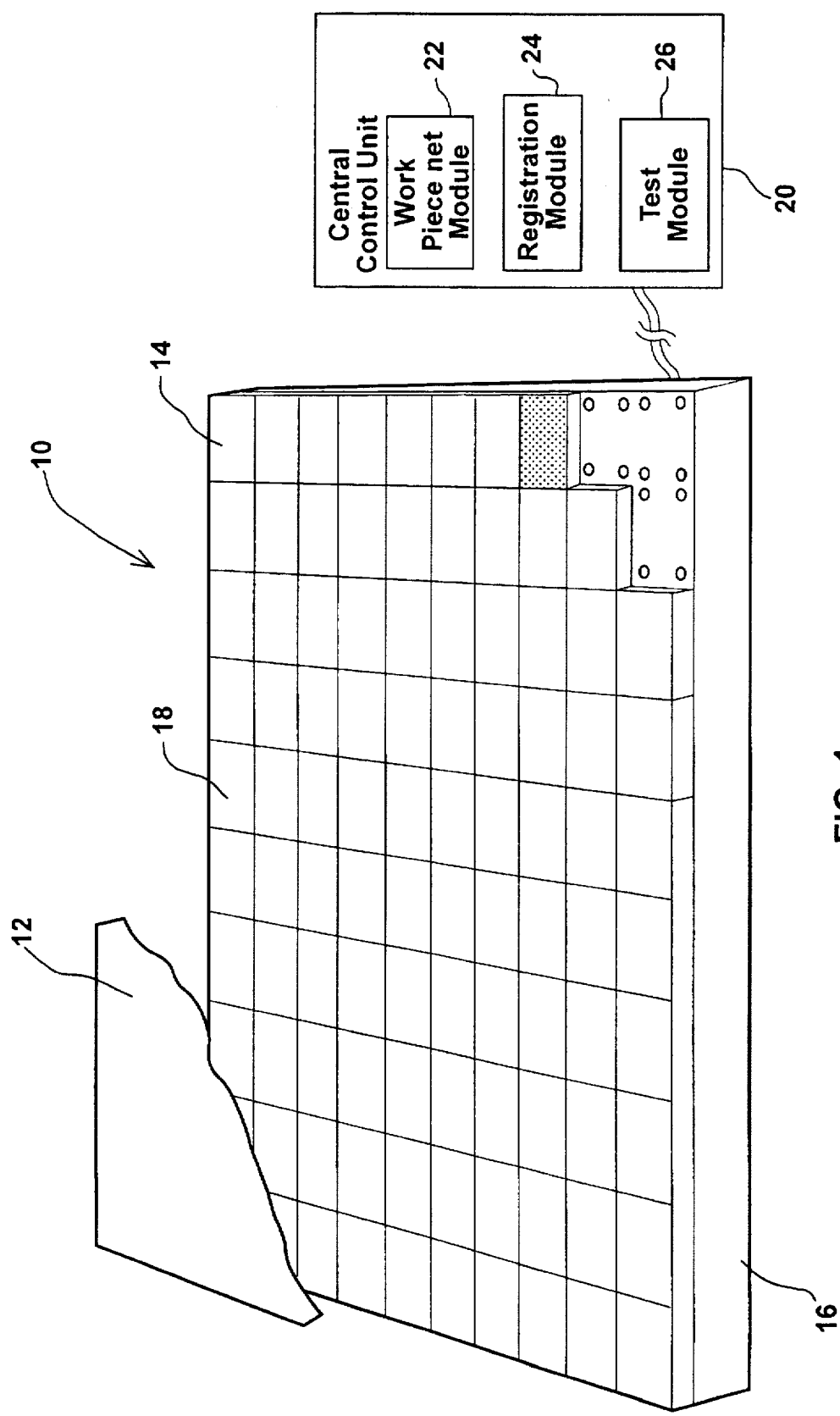
FIG. 1 is a schematic view of a universal fixtureless automatic test equipment constructed and operative according to the teaching of the present invention, for testing and verifying a Workpiece Under Test (WUT)

The heart of the universal fixtureless automatic test equipment is the Independent Test Module-ITM. Continuous test areas, flexibly dimensioned and as large as required, can be easily built up from a plurality of ITMs, as illustrated in FIG. 1. A typical ITM includes a plurality of flipped ASIC dies. A typical die includes a matrix of bi-directional memorized switching cells, independently selectable. A typical die is surfaced by an array of terminal-pads, one for every switching cell. In the present invention a density of 13 terminal pads/mm sq. is designed. The dies are flipped and mounted on an Adapter/Pitch-Translator (APT), employing Flip chip technology-FpC, so that the surface with the terminal-pad array faces the APT. In the present invention, the APT is made of a PCB substrate, fabricated using the Laser Drill Process or the Plasma Drill Process. The APT mechanically supports the delicate dies and extends their terminal pads with individual leads ended with bumps, in order to create test electrodes. The ends with the bumps are re-pitched to produce a continuous, uniform test electrodes mattress. This advantageous system enables meeting the requirements of future technological advances by re-designing new APTs adaptable with technological advancements needs. One example of such a design is shown in FIG. 2b.

The APT may extend either horizontally, using the traditional PCB layout system, or vertically, using overlaid metallic layers shaped as "comb-teeth" and laminated with insulating laminates in between. This is illustrated in FIG. 2b. It should be mentioned that being that the dies reside next to the tested workpiece together with the vertical configuration has a remarkable advantage in that a short smooth tracing (without via-pads and sharp turns) is provided between the terminal pads of the flipped dies and their respective test electrodes, achieving a superior signal-to-noise ratio and preventing crosstalk.

The test equipment is designed to enable soft, kiss-touch deployment on a workpiece. According to one embodiment of the invention the test electrodes are realized as micronic compressible bumps or as rigid bumps (grown gold-dot, for instance), assisted by soft nonconductive cushion filled with micronic conductive particles, silver for instance. The fragile semiconductor dies are shielded, in a rigid structure, in a floating state in order to prevent any kind of mechanical strain exerted from damaging the dies.

Thus, a complex of shielded semiconductor dies, an APT and a soft electrode mattress together build up a typical Independent Test Module (ITM).

The test electrodes are dimensioned to guarantee that each tested element on a WUT will correspond with at least two of the test electrodes. At the same time, the test electrode is dimensioned to prevent shortages between adjacent pairs of tested elements. Such a structure is implemented in the present invention using the Precise Printing and Stenciling Process, or the Laser Etching Process.

Because the test area is constructed of electrically and mechanically independent ITMs, variations in height of different sections of the WUT relative to the plain surface of the compressible test mattress are accommodated by employing a dual stage adjustment. First, a compressible supporting means enables each of the ITMs to individually tolerate a respective section of the WUT with which it comes into contact. Thus, different ITMs can be at different heights under same pressure. A finer adjustment is accomplished by employing rubber-like bumps (test electrodes), or alternatively, a bumped Z-axis cushion. This is expected to tolerate finer height differences within the area of an individual test module. Thus, height differences on different sections of the WUT are tolerated to enable non-damaging kiss touching the elements with minimal pressure.

Electrically, the universal fixtureless automatic test equipment is uniquely structured to achieve, together with an advantageous mechanical structure, a high test performance, enabling remarkably efficient test methods.

A typical semiconductor die includes a controlled switching matrix of selectable switching cells (SC). The switching cells are memorized so that they function independently. Because each cell functions autonomously, any number of switching cells can be set to function as inputs, while the entire remainder of switching cells can be set to function as outputs. This can be advantageous when testing a multiple element node. In this mode of test, one of the switching cells contacting the tested multi-element node is programmed to function as input, while the rest of the plurality of switching cells function as parallel outputs. Thus, the information entering into a single input switching cell can be simultaneously detected by all of the output switching cells. This test is defined as a Simultaneous Multiple Reference Tests (SMRT). Employing such a test, a contact break detected in a branch of the multi-terminal net helps to precisely locate the defect.

The APT is a multi function component designed to mechanically support the fragile semiconductor dies on one surface and the delicate, compressible micronic bumps on the other surface. The dies are flipped so that their terminal arrays face the supporting surface of the APT. Each terminal pad is engaged with a respective lead of the APT. The die is glued to the APT, leaving air gaps as clearances in the surrounding, and on the upper, surface. There is no immediate contact with any other component. Being in floating state, the dies do not suffer from any strain exerted on the system during the test. Further, the APT adapts the terminal pads of the dies with the bump mattress. It should be mentioned that immediate contact with the test electrodes could be destructive, even under minimal mechanical pressure. The APT enables a continuous uniform mattress of probes, adaptable to the requirements of the advancing technologies.

The probe mattress is the part of the system deployed to operatively test the WUT. The bumps which function as independent test electrodes are dimensioned to guarantee that each tested element on a workpiece will correspond with at least two of the test electrodes. At the same time, the bumps are dimensioned to prevent shortages between adjacent pairs of tested elements. According to a preferred embodiment, the bumps are made of compressible conductive polymer, designed to guarantee reliable contact while "kiss-touching" the tested elements, providing a low pressure exertion to prevent mechanical damage to the WUT. Rigid bumps assisted by compressible cushion with conductive particles is another preferred embodiment of the present invention.

This significant feature affords a number of benefits: a. testing individual elements; b. verifying whether an "open" signal is the result of a net break between elements in the tested workpiece, or the result of a poor contact of a test electrode; c. testing a single-terminal net such as fiducials and other floating copper areas; d. optimization of pressure applied to the WUT by verifying the minimum contact pressure necessary to ensure reliable contact, (this is important for reducing the damage done to the workpiece in the course of the testing); e. locating single elements in relation to the test mattress, (this is essential for employing the Auto-Accord system by re-valuing the X;Y values of the tested elements in the reference test file, instead of precise registration of the WUT); f. measuring the properties of the contact between a test probe and an element, such as resistance and impedance; g. testing even when certain of the test probes are defective.

Referring now to the drawings, FIG. 1 illustrates a universal fixtureless automatic test equipment, generally designated 10, constructed and operative according to the teachings of the present invention, for testing a workpiece 12. Workpiece 12 can be a printed wiring board (PWB), an integrated circuit semiconductor die, and the like. For the sake of exposition, automatic test equipment 10 is implemented for testing and verifying the bottom side of a workpiece. However, it should be noted that automatic test equipment 10 can be implemented for testing and verifying both the top surface and the bottom surface of a workpiece.

The universal fixtureless automatic test equipment 10 includes an array of modular ASIC devices 14 plugged into a chassis 16 so as to render a test mattress 18 for kiss touch deployment against workpiece 12. ASICs 14 communicate with a controller unit 20, preferably realized as a computer, which typically includes the following modules: First, a workpiece net module 22 for storing the nets of workpieces 12 to be tested by automatic test equipment 10. Second, a registration module 24 for enabling the registration between chassis 16, and therefore test mattress 18, and workpiece 12. And lastly, a test module 26 for testing and verifying different aspects of functionality of workpiece 12 such as continuity, insulation resistance, detection of undesirable opens and shorts, improper connections, etc.

Figure 2A:
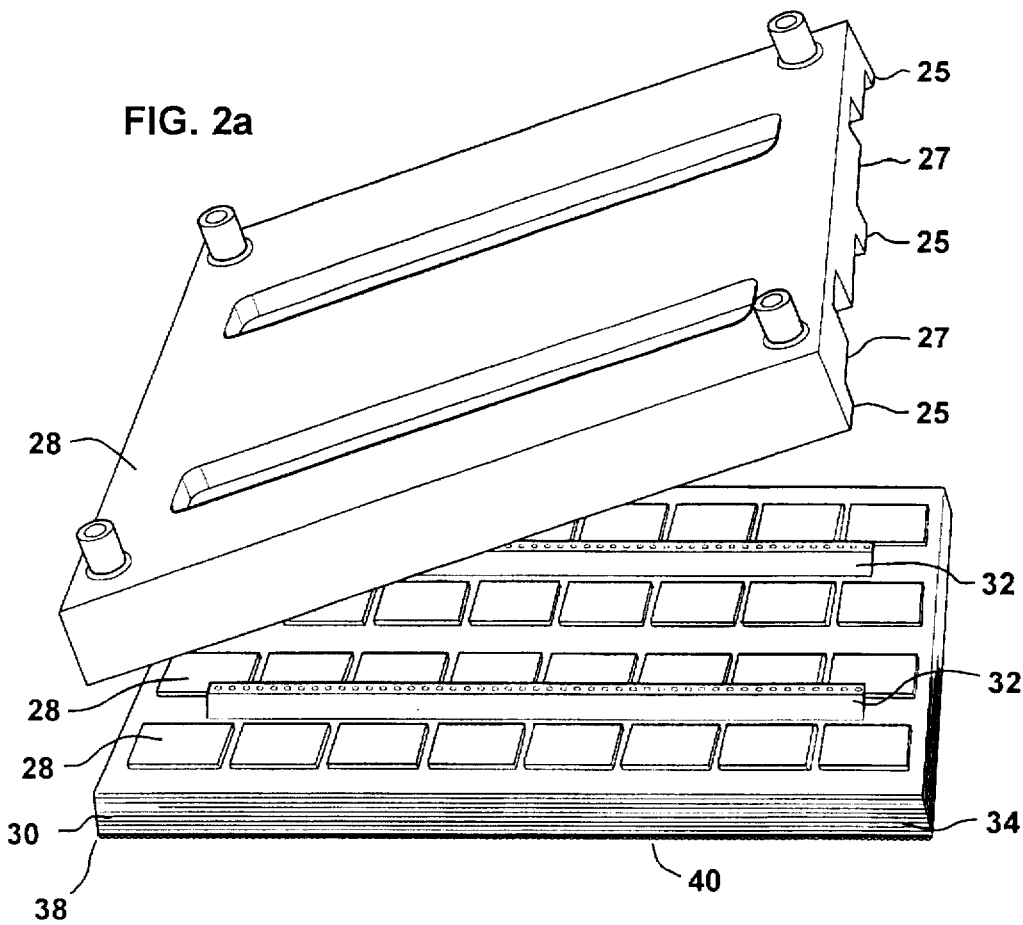
FIGS. 2a and 2b are schematic views of two embodiments of an Independent Test Module (ITM) of the universal fixtureless automatic test equipment of FIG. 1.
Figure 2B:
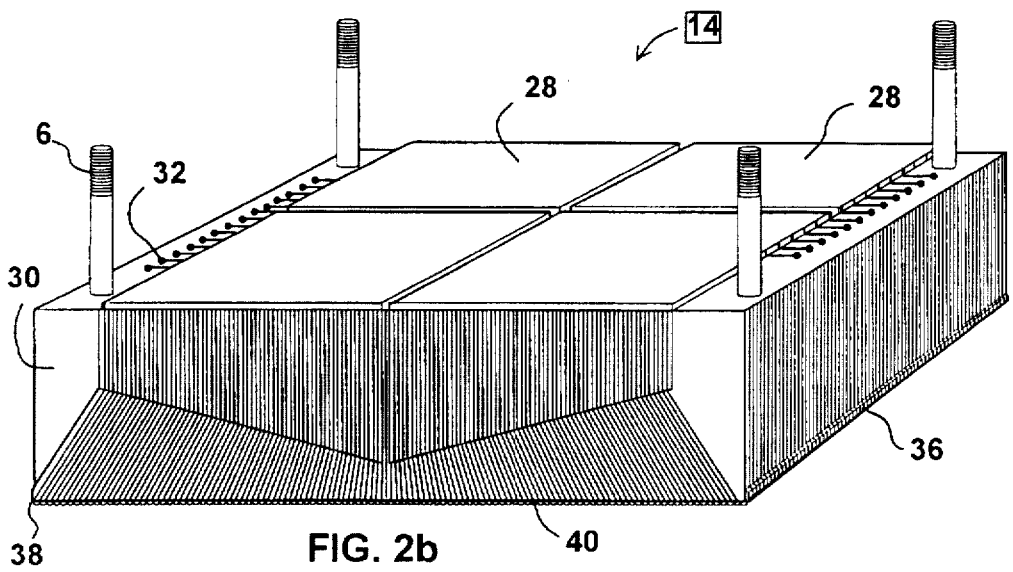

With reference now to FIGS. 2a and 2b, each module 14 includes an array of semiconductor dies 28 mounted on adapter 30, having mounting screws 6, and connected to one or more communication ports 32 for connection to controller unit 20. Hence, in actual fact, test mattress 18 is, in effect, an array of adapters 30 deployed side by side. Adapter 30 can be implemented by either horizontally deployed printed circuit boards 34 (FIG. 2a) or vertically deployed metallic sheets 36 (FIG. 2b) shaped as "comb-teeth" and laminated with insulating laminates in between. It should be noted that the configuration of adapter 30 shown in FIG. 2b is particularly useful for testing and verifying workpieces 12 at high frequencies due to the elimination of vias of two 90° turns which badly affect test results of workpieces designed to withstand high frequency applications. Protective rigid housing 23 is featured to mechanically support adapter 30 by direct physical contact with protrusions 25. Thus, housing 23 provides air gaps between recessed housing surface 27 and the upper and surrounding surfaces of dies 28. Dies 28 are therefore arranged in a floating manner and the physical pressure exerted on the ITM during the test does not affect the dies, because this pressure is transmitted directly to compressible elements 37 and base plate 39 (both shown in FIG. 3) via protrusions 25.

Figure 3:
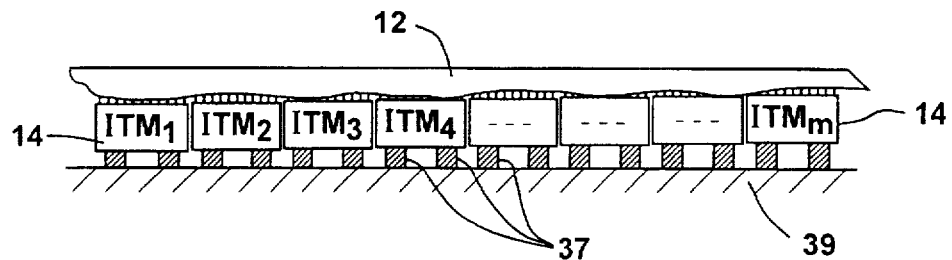
FIG. 3 depicts the principle of individual differential engagement of different ITMs with a WUT.

FIG. 3 illustrates how different ITMs 14 independently match and tolerate surface height variations of tested workpiece 12. Initially, each ITM roughly engages the respective area of the tested workpiece aided by elements 37 of the compressible layer. A finer adjustment is provided by compressible test probes 38 which adjust to minor height variations of various elements in the respective area of each ITM.

Figure 4:
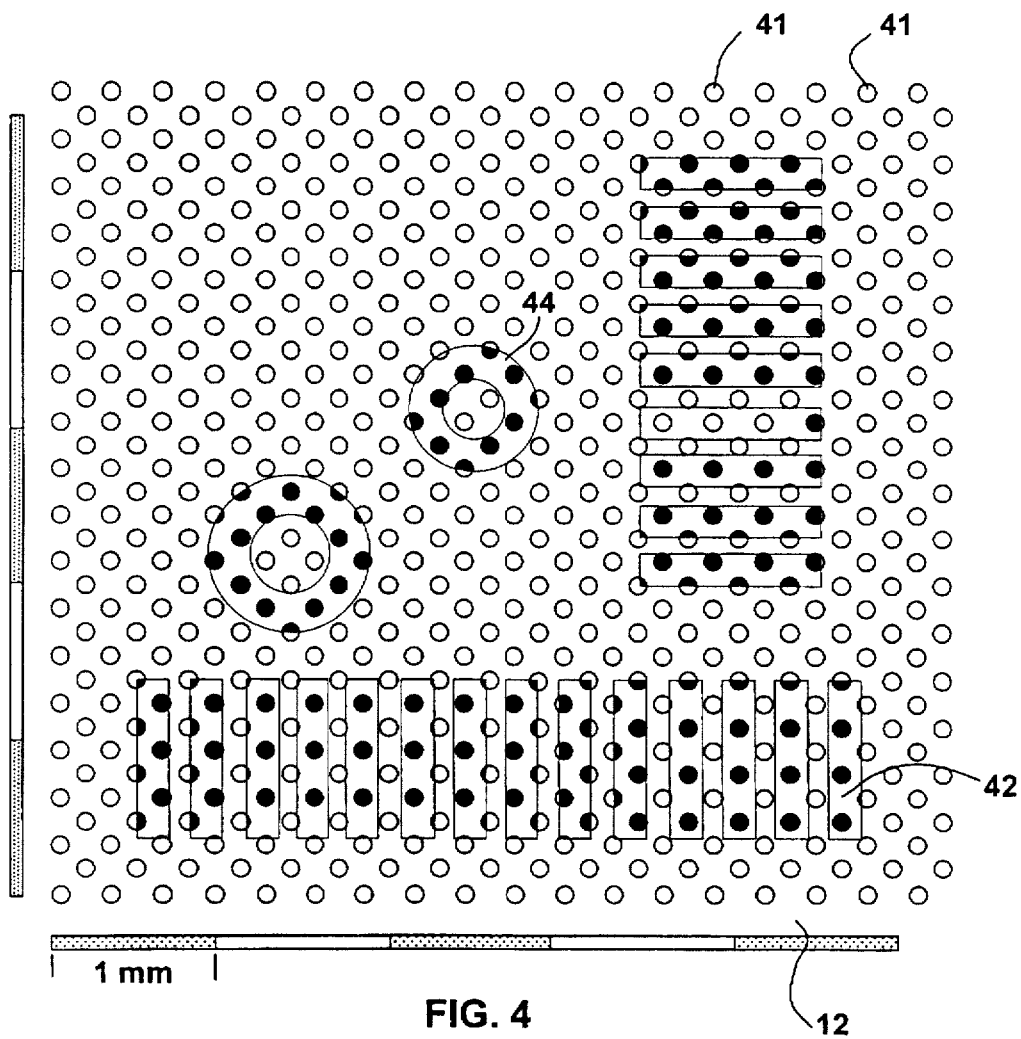
FIG. 4 is a schematic view of a footprint of a test mattress of the universal fixtureless automatic test equipment of FIG. 1 on pads of a WUT.

With reference now to FIG. 4, each adapter 30 includes a matrix of probes, generally designated 38, on its exposed side for deployment against workpiece 12. Probes 40 of matrix 38 are preferably arranged according to a double density arrangement of staggered rows of probes so as to achieve a higher probe density. As will be described hereinbelow with reference to FIG. 5a, each probe 40 of adapter 30 is connected to a terminal of switching cell 46 implemented in semiconductor die 28.

Matrix 38 is preferably realized according to one of the following two techniques: First, by realizing probes 40 as elastomeric electrically conductive bumps such that the bumps themselves can accommodate different object heights depending on the degree that they are compressed. Typically bumps are prepared from conductive elastomeric polymer applied using precise screen printing technology. For more information about this technique, reference is made to US patents assigned to Epoxy Technology Ltd., USA and other material in the public domain from Epoxy Technology Ltd., USA, which is incorporated herein by reference. It is well known that bumps prepared by this technique are micronic and can be arranged in a high bump density.

Alternatively, by realizing probes 40 as rigid cones which are then spaced from workpiece 12 by a relatively thin cushion (not shown) made up of an insulating silicon rubber sheet with silver particles embedded therein. Such cones are prepared through a process known in the art as the grown gold-dot process. For more information about this technique, reference is made to U.S. Pat. No. 4,125,310 for a Gold Dot Interconnection System which is incorporated herein by reference. It is well known that cones prepared by this technique are small and can be arranged in a high bump density. In this case, it should be noted that it is the cushion which is compressed to varying thickness to accommodate different objects heights.

All in all, test mattress 18 achieves the following objectives: First, that probes 40 achieve reliable contact with all the elements of workpiece 12 notwithstanding their non-uniform object heights while ensuring that adjacent probes 40 do not short each other when test mattress 18 is deployed against workpiece 12. Second, that probes 40 do not leave witness marks and physical damages such as notches and cavities on workpiece 12. Third, that the dimensions of probes 40 are such that a single probe cannot short two adjacent elements of workpiece 12. Fourth, that the probe density of probes 40 is such that at least two probes are in contact with each and every tested pad on workpiece 12 to enable testing of single-terminal nets and to provide no false-open reporting as may happen in a single-probe touch. And lastly, the test equipment enables optimization of the pressure applied on workpiece 12.

As can be clearly seen in FIG. 4, footprints 41 of probes 40 are depicted relative to a typical feature layout of workpiece 12 so as to clearly illustrate the kiss touching of at least two probes 40 on a single element realized as either SMD pads 42 or thru-hole pads 44. The footprints of probes 40 which are in electrical contact with one of the features of workpiece 12 are shown dark while, in contrast, the footprints of probes 40 which are not in electrical contact with features of workpiece 12 are shown light.

Figure 5A:
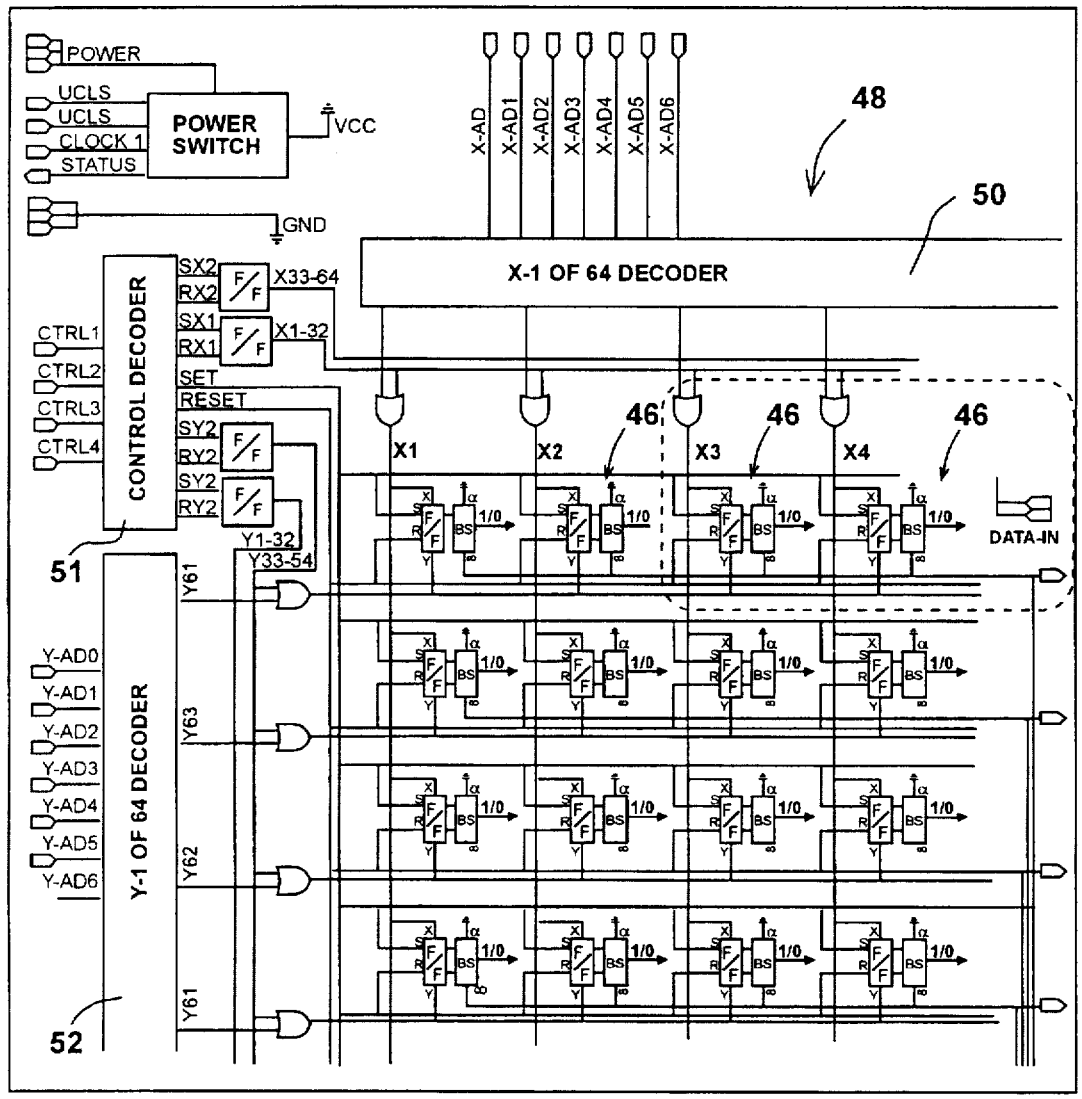
FIG. 5a is an electrical schematic view of a portion of a switching matrix as a part of the architecture of a typical semiconductor die.

With reference now to FIG. 5a, each semiconductor die 28 is a novel dedicated ASIC manufactured using conventional semiconductor die fabrication technology to enable in-place switching between switching cells 46 of a matrix of switching cells featuring a low switching resistance, generally designated 48. Typically, a semiconductor die 28 includes a 64×64 matrix 48 providing a total of 4096 switching cells 46, however, the size of matrix 48 can be varied depending on the application at hand and optimization strategy.

Furthermore, each semiconductor die 28 includes a X-axis decoder 50 for providing an X-axis address, a Y-axis decoder 52 for providing a Y-axis address and a control decoder 51 for determining the logic state of switching cells 46. It should be noted that each switching cell 46 is addressed by addressing its column line and its row line either singly or in combination with other column lines or row lines. In the case that multiple row lines are addressed, then only one column line can be addressed so as to select all the switching cells in that column. Alternatively, in the case that multiple column lines are addressed, then only one row line can be addressed so as to select all the switching cells in that row.

Figure 5B:
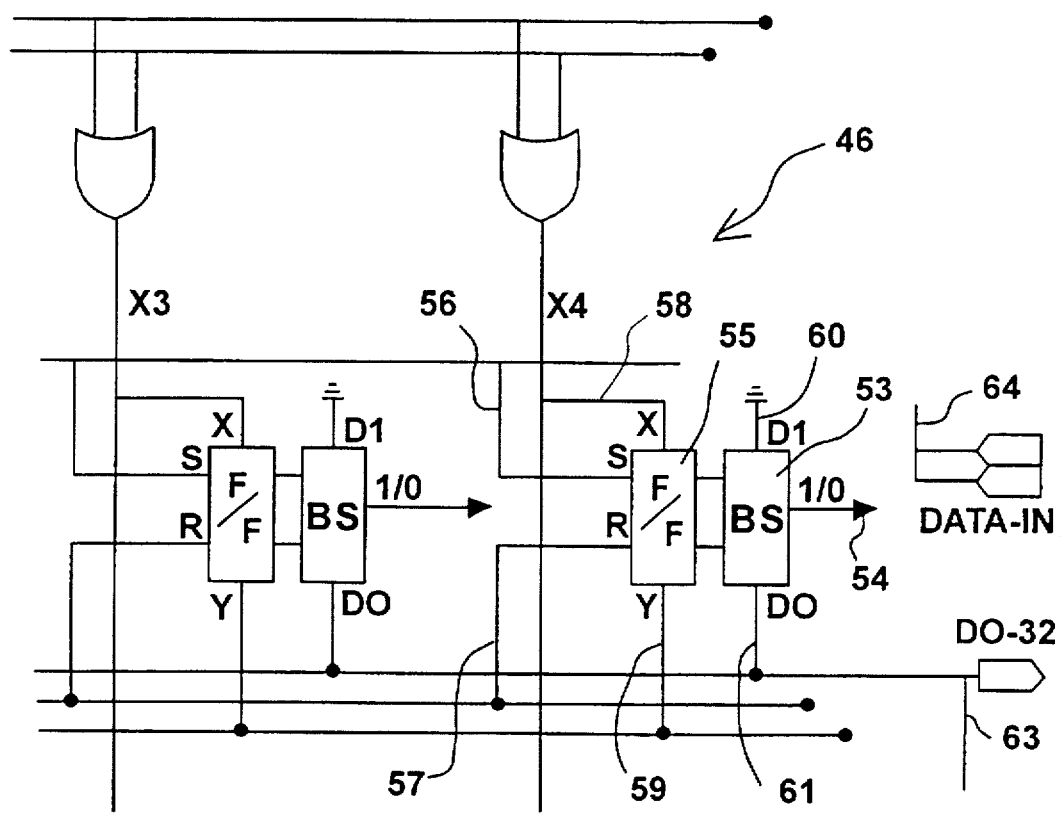
Figure 6A:
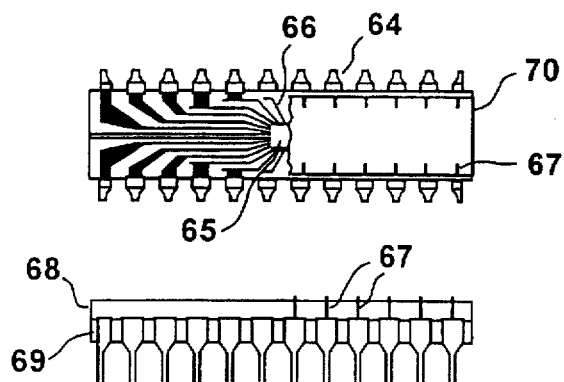
FIG. 6a–d illustrates a novel configuration of components of a populated workpiece facilitating applying In Circuit Test equipment (ICT).
Figure 6B:
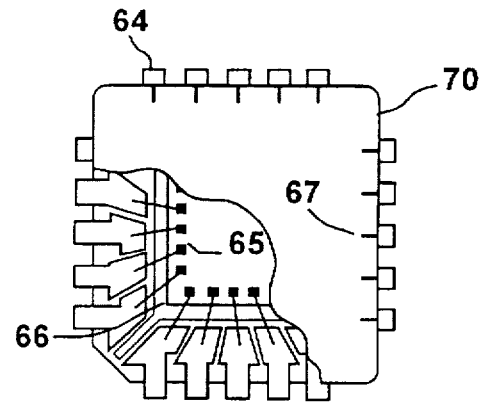
Figure 6C:
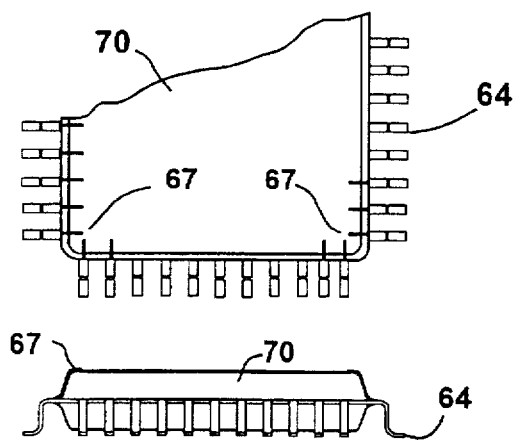
Figure 6D:
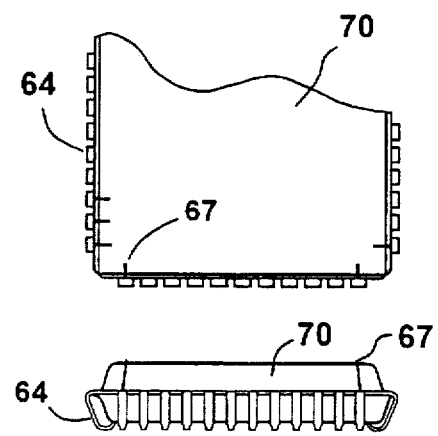

With reference now to FIG. 5b, each switching cell 46 is implemented as a Bi-directional Switch (BS) 53 having an input/output (I/O) terminal 54 and a control latch 55 such that each switching cell 46 can be set as an input port or as an output port. For the sake of exposition only, each switching cell 46 is realized as two three-state analog switches having SET (S) and RESET (R) inputs 56 and 57, respectively, connected to control decoder 51, an X-address input 58 connected to X-address decoder 50, a Y-address input 59 connected to a Y-address decoder 52, a DATA-IN (DI) terminal 60 connected to a data in line 62 which is, in turn, connected to controller unit 20 and a DATA-OUT (DO) terminal 61 connected to a data out line 63 which is, in turn, connected to controller unit 20.

The preferable conventional employed in automatic test equipment 10 is as follows: Logic state "1" indicates an electrical connection through workpiece 12 between a pair of switching cells 38 in contact with one or two of the electrically conductive elements on workpiece 12. And, logic state "0" indicates an electrical break through workpiece 12 between a pair of switching cells 38 in contact with one or two of the electrically conductive elements on workpiece 12.

As will become evident hereinbelow, a pair of switching cells 38 can be in contact with the same element on workpiece 12 or on different elements on workpiece 12 which are electrically connected. Furthermore, one of the pair of switching cells 38 can be on a first semiconductor die 28 while the other of the pair of switching cells 38 can be on a second semiconductor die 28.

FIGS. 6a–6d illustrate various shapes of standard packaging 70 of integrated circuits (IC). Metallic leads 64 connect to fanout terminals 65 of die 66 and are sandwiched between protective plastic or ceramic plates 68 and 69. Leads 64 are soldered to a respective footprint on the workpiece in order to build up, together with other soldered components, an integrated assembly functioning as one unit. Metallic filaments 67 are added to each of the plurality of leads 64 and are turned toward the outer surface of the IC package. In this way, fanout terminals 65 are directly accessible by test probes via filament 67. In this manner, traditional fanout testpoints on the workpiece are eliminated the workpiece can be further miniaturized.

Modern designs employ as many IC circuits as possible to replace discrete components. Almost every node of any electronic design include at least one connection with an IC fanout lead. This enables testing the node by probing the outer surfaces of the plurality of ICs instead of employing dedicated testpoints on the workpiece.

Figure 7A:
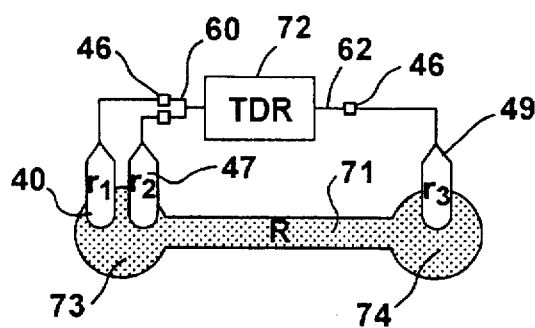
FIGS. 7a–b illustrates a novel measuring method of impedance and resistance.
Figure 7B:
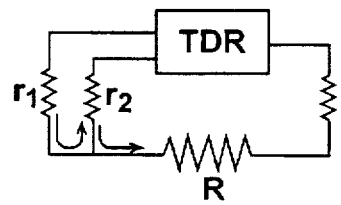

FIG. 7a illustrates how the impedance and/or resistance R of conductive line 71 is measured using Time Domain Reflectometer (TDR) 72. Thus, in the Figure one probe of TDR 72 is connected as input to a plurality of test electrodes 40 and 47 (having respective resistances represented in the Figure by r1 and r2) via DATA-IN line 60 and switching cells 46 featuring low switching resistance. Conductive line 71 features resistance R to be measured. Terminal 74 of conductive line 71 is touched by test electrode 49 (having a resistance represented in the Figure as r3). Thus, a plurality of test circuits are formed with TDR 72 via switching cells 46 connected to DATA-IN line 60 and DATA-OUT line 62. Equivalent electrical circuitry is shown in FIG. 7b.

The feature of the present invention guaranteeing at least two test probes for every element on a workpiece under test regardless of placement orientation has a profound impact on test and measurement (T&M) procedures and capabilities. A method for measuring impedance and/or resistance is presently elaborated.

Impedance & Resistance Measuring Method: These measurements must be absolutely precise, especially when testing a controlled impedance. Special measuring instrumentation, such as a Time Domain Reflectometer (TDR), assisted by calibrated test cables is used for this manner of testing. Hence, it is a fundamental requirement to provide a precise and reliable measuring system that eliminates different factors of parasitic resistance resulting from uncontrolled elements such as contamination on the tested points, quality of connections along the test circuit, etc. Parasitic resistance is defined as any resistance other than the resistance measured.

Further expression of the highly advantageous potential of guaranteeing at least two test probes for every element on a WUT, can be recognized by the ability of the present invention to easily master measuring the impedance and resistance of nodes, down to their branches. Following is a presentation of the method showing how parasitic elements of the measured resistance are eliminated by employing two probes on one terminal of the tested line, so that resistance R can be precisely measured. The varied resistance of cables and terminals on TDR 72 are assumed as known and are not included in the calculation in order to simplify presentation:

Since in terms of precision, the resistance of various probes differ from each other, four unknown resistance values: R; r1; r2 and r3 are presented, in the circuit shown in FIG. 7a. r1; r2 and r3 are the parasitic resistance of the testing probes, and R is the resistance to be measured. FIG. 7b illustrates an electrical schematic of the Circuit Under Test (CUT). It should be noted that probes touching the same point are considered to be parallel connected. In this case, four measurements (M) expressed by mathematical equations can be applied:

$$Ma = r1 + R + r3$$

$$Mb = r2 + R + r3$$

$$Mc = r1 + r2$$

$$Md = r1 \| r2 + R + r3$$

where r1∥r2 represents a parallel connection of r1 and r2.

$$r1 \| r2 = [1/r1 + 1/r2]$$

Thus, all of the four unknown resistance values can be easily calculated. Accordingly, any resistance R on the WUT can be precisely measured. It should be noted too, that two parallel probes are needed on only one terminal of the CUT.

The number of applicable tests on a CUT is related to the number of probes touching the CUT terminals. This is expressed by the following general equation:

$$M_x = (2^n - 1)(2^m - 1).$$

Mx is the number of test variations; n is the number of probes on one terminal of the CUT and m is the number of probes touching the other terminal of the CUT. It should be noted that, the more probes contact the CUT, the more equations (test variations) are obtained, which means that more cross testing can be performed. The more indications available, the more precise the final result will be. Since every tested element is touched by at least two test probes, and some of them can further be touched by three or more test probes, a very high degree of precision can be obtained on the fly.

Figure 8:
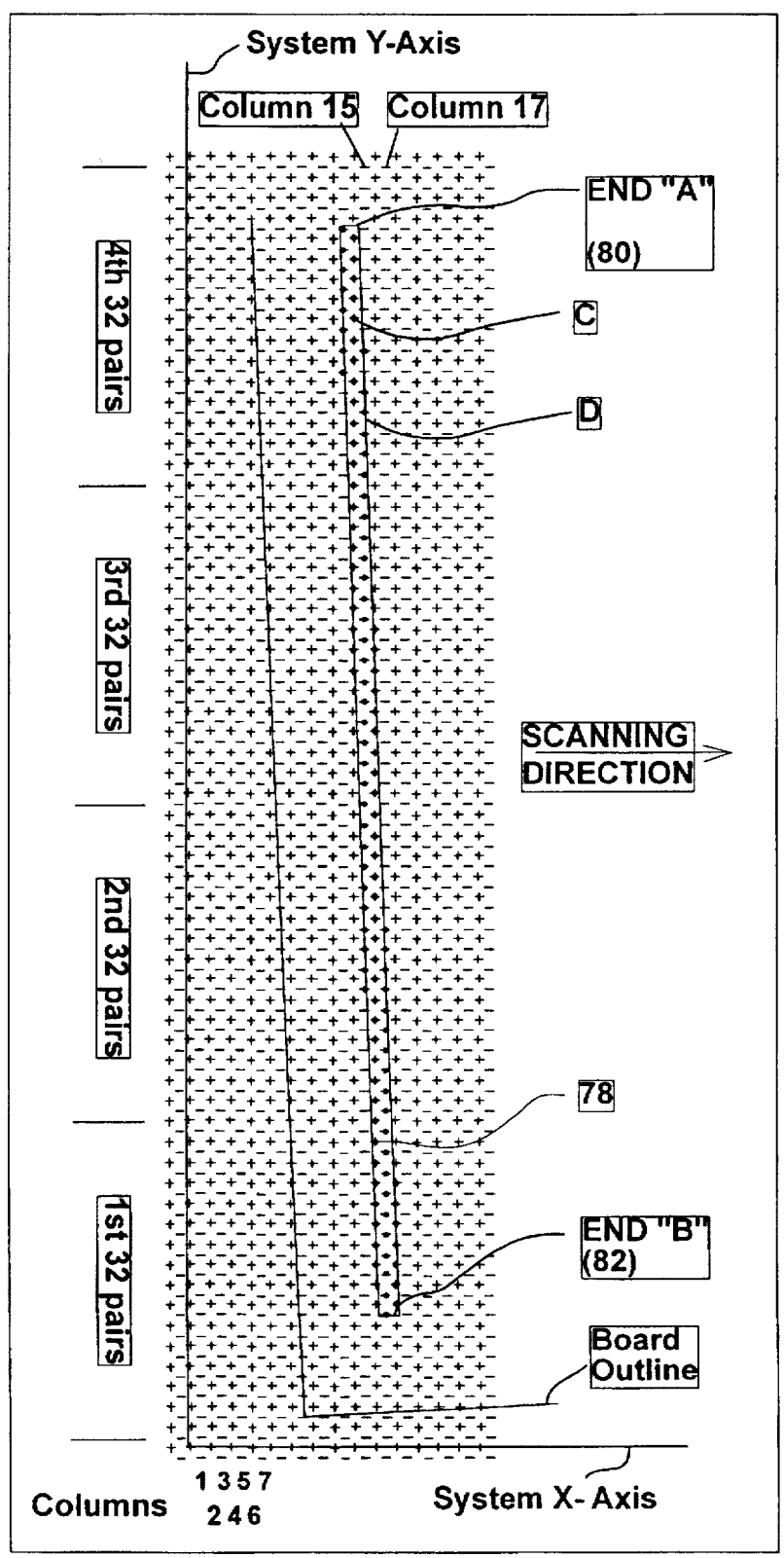
FIG. 8 is a schematic view of a test bar residing on a WUT for use in a novel registration algorithm enabling the registration between the WUT and the test mattress of the universal fixtureless automatic test equipment.

The operation of automatic test equipment 10 is now described with reference to FIG. 8. First, automatic test equipment 10 is set up to test and verify a particular workpiece 12 under test. The set-up includes determining the size of test mattress 18 required to overlay workpiece 12, loading the net of workpiece 12 into workpiece net module 22 and loading the required functionality tests into test module 26.

Second, the registration between workpiece 12 and test mattress 18 has to be determined before the functionality testing and verifying of workpiece 12 can be initiated. The registration is achieved by any registration algorithm designed to determine the location and the orientation of workpiece 12 relative to test mattress 18. It should be noted that in the case that workpiece 12 is placed precisely at the origin of the reference coordinate system and the placement angle is 0°, then the X;Y values in workpiece net module 22 do not have to be updated.

The great strides with which the concerned technologies are advancing, make the feasibility of functionality testing a major concern. The above descriptions regarding the novel structure of the switching matrix of the present invention, enable powerful test methods that significantly impact the throughput of a test system. Thus, the feature of the present invention, guaranteeing at least two test probes for every element on a workpiece under test regardless of placement orientation, is the cornerstone of implementing a novel Auto-accord strategy. One such method of registration is presently explained.

Soft-Registration Method: It is a particular feature of the present invention that the universal fixtureless automatic test equipment enables the testing and verifying of the functionality of a workpiece without the traditional precise deployment of the workpiece relative to the test mattress. Instead, the system scans the randomly placed WUT and samples sequential series of X;Y values of the first detected conductive line of the WUT, while tracing its direction by GO/NOGO tests. For convenience, this could be a test bar traced in parallel with the workpiece outline or, alternatively, any two connected tested elements. Using this information, the incline angle of the detected line can simply be obtained. Since it is obvious that this differential incline angle is typical for all points on the WUT, the location, and the orientation of the WUT can be determined. Thereafter, the X;Y values of the reference file describing element locations obtained from the PCB design database, are re-valued to zero offsets and to be adjusted with the respective X;Y values of elements of the random placed WUT.

Thus, by contrast to the currently known systems in which parts of the test machine and the tested PCB are the dynamic elements, this method uses Auto-according of X;Y values of the reference file as the dynamic element. These values are adjusted (or, Auto-accorded) with the X;Y values of the freely placed WUT. This trivial procedure is performed individually for every tested workpiece. Thus, it can be readily appreciated that the novel registration technique obviates the need for expensive robotics equipment and optical-alignment instrumentation.

It should be mentioned that many other different algorithms based on the aforementioned technique can be implemented to achieve "soft" registration (i.e., registration implemented by software).

For the sake of exposition only, the registration algorithm described hereinbelow uses one or more test bars deployed on workpiece 12 such that they are the first elements on workpiece 12 to be encountered when scanning workpiece 12. Broadly speaking, the registration algorithm systematically addressing adjacent switching cells 38 until registration module 24 detects the starting and finishing ends of the test bars so as to provide X and Y-value offsets relative to a reference co-ordinate system and a placement angle.

Typically, one of the test bars is preferably a straight bar extending from the bottom leftmost possible location along the Y-axis whereas the second test bar is a straight bar extending from the top rightmost possible location along the X-axis. A typical test bar 78 having an end "A" 80 and an end "B" 82 is depicted on workpiece 12. As will become apparent hereinbelow, the designation of ends "A" and "B" as the start and finish ends of test bar 78 is dependent on the orientation of workpiece 12 relative to the reference point of test mattress 18. Furthermore, it will also be readily appreciated that the longer the test bars so the more accurate the registration results.

For test bar 78, scanning starts from left to right using the column-to-column addressing mode described hereinabove. Registration module 24 selects alternate columns to be a column of input ports depicted as "+" and a column of output ports depicted as "−". Registration module 24 continues to select alternate pairs of columns until the first connection between adjacent switching cells 38 is detected. In this case, the first connection between adjacent switching cells 38 is detected on selection of Columns 15 and 16. As shown, end "A" 80 is detected before end "B" due to the counter clockwise orientation of workpiece 12 relative to test mattress 18.

Thereafter, registration module 24 continues to scan adjacent pairs of switching cells 38 to determine the point at which there is no longer any electrical connection through workpiece 12. In this case, this occurs at the point depicted C. Registration module 24 then proceeds to select the next alternate pairs of columns until again, this time at point D, there is no longer any electrical connection through workpiece 12 through adjacent switching cells 38. This step like scanning process continues until such time that registration module 24 detects the last connection between adjacent switching cells 38. In this case, end "B" 82 is the finish end of test bar 78 and the last connection between adjacent switching cells 38 is detected on selection of Columns 21 and 22.

After the registration algorithm determines the linear X-value and Y-value offsets relative to a reference co-ordinate system and a placement angle, registration module 24 updates the X;Y values in workpiece net module 22 to such that the X;Y values resident in the reference file of workpiece 12 are relative to the reference point of test mattress 18. In other words, registration module 24 compares the detected X;Y values of the start point and finish points of test-bars with the X;Y values of the respective points in the reference file residing in PWB net module 22 and updates the X;Y values in the reference file residing in PWB net module 22 accordingly. Hence, it can be readily appreciated that it is a particular advantage of the present invention that automatic test equipment 10 does not require complex robotics and optical alignment equipment.

Third, the functionality testing of workpiece 12 is initiated by test module 26. Test module 26 is designed to perform a number of test as follows: First, an element test to verify that there is no electrical break along an element. The element test is achieved by selecting two probes on the same element and determining that one of the probes is the input port and the other probe is the output port. Second, a point-to-point net test to verify that there is no electrical break along a net between an input port and an output port. The point-to-point element test is achieved by selecting one probe on the input port of the net and a second probe on the output port of the net. And third, a point-to-"multi-point" test to verify that there is no electrical break along a net between an input port and more than one output ports. The point-to-"multi-point" test is achieved by selecting one probe on the input port of the net and a probe on each of the output ports of the net. A number of novel test methods afforded by the test equipment of the present invention are described below.

Simultaneous Multiple Reference Test (SMRT): This method enables performing a one-shot conductivity test for an entire node instead of point to point testing. This is because any switching cell (SC) of a plurality of SCs that are in contact with the tested multi-element node can be programmed to function as input, while the rest of the plurality of SCs function as outputs. Therefore, the information flowing into the single input can be simultaneously referred to by all of the output SCs. A contact break in a branch of the multi-terminal net is detected when the information is not received at the respective output SC. Thus, according to a preferred embodiment of the present invention, a system featuring 32 simultaneous different outputs is provided. The number of simultaneous outputs is determined by the bandwidth of the data-out bus according to design strategy. For example, a 64-data-out bus is possible.

Simultaneous Multiple Node Test (SMNT): This is a more efficient conductivity test. It enables various nodes with a total of up to 32 outputs (according to the present invention), to be simultaneously tested.

Simultaneous Multiple Circuit Test (SMCT): This is a still more efficient conductivity test. It enables testing several copies of the WUT simultaneously while applying both of the SMRT and SMNT methods. The number of copies to be simultaneously tested depends on the dimensions of the test area and the dimensions of the tested WUT.

The magnitude of difference between the conventional "point to point" test and the test methods of the present invention presented above will be more perceptible by the following demonstration.

Using the "point to point" test system, in order to test a node netted to N elements, N−1 test cycles are required. Further, a conductivity test on a PCB including N nets with a total of M elements, requires N−M test cycles (because the input terminals are neglected). For instance, a net with 1,200 nets and a total of 10,000 tested elements would require 8,800 test cycles. The short-cut test is the test in which performance and throughput of a test system are more essential. Short-cut testing of a PCB with N nets would require far more cycles: $N^2/2$ cross check cycles are required. As the number of tested nodes increases, the number of short-cut test cycles grows by an order of magnitude. For example, an increase in the number of test nets from N to N+W, will demand an increase in the number of short cut tests from $N^2/2$ to $(N+W)^2/2$. Thus testing a PCB with 1,000 nets and 10,000 tested elements would require 500,000 test cycles; and a PCB with 1,500 nets and the same 10,000 tested elements would require 1,250,000 test cycles.

By contrast, according to the teachings of the present invention, independent switching cells with a memory and a multiple-data-out bus are provided, enabling a conductivity test of a PCB including N nets in far fewer test cycles. Assuming the preferred embodiment discussed above, in which a 32 data-out bus is featured, the above example would require around N cycles. Nets with more than 33 test pads would require additional test cycles accordingly. Assuming a PCB with 1,200 nets and a total of 10,000 terminals, there would be 100 nodes that require an average of two test cycles per node. This would require a total of between ~400 [=10,000/32+100] and 1,200 test cycles.

Further, a highly effective short-cut test can be achieved by allowing multiple parallel tests to be carried out simultaneously. All N nodes on a WUT are commonly connected to one pole of the test circuit (for example to ground). By switching over one node at a time to be connected to the positive pole of the test circuit, a one-shot "go/nogo" indication of whether the switched node is in shortcut with any of the rest (N-1) can be applied. Thus, only N-1 short-cut tests are needed in case no shortcuts are detected. In the case in which shortcuts are detected, an additional test stage is necessary. However, since only PCBs with a low predetermined number of repairable shorts (of the order of $o^1$) can be regarded as acceptable, this stage of testing has to deal only with few additional tests employing the "multiple bisection method" commonly known to those skilled in the art, only to the problematic nodes. In this stage, the problematic nodes are bisectioned and retested over and over until the short is detected.

Therefore, the number of shortcut tests in this mode remains in the order of o(N), which stands in remarkable contrast to the "point to point" system which is of order of $o(N^2)$.

Pressure Optimization Method: In traditional "Bed of Nails" ATEs, far more pressure than needed is applied in order to assure simultaneous reliable contact of thousands of nail probes. This causes deflection of a lot of probes in different directions resulting in direct short-contact between adjacent probes. This in turn causes false short detection. The test becomes unreliable since one can never know whether the detected short is a result of fabrication or design defect or caused by excessive pressure on the test equipment.

Moreover, in case the pressure exerted is not high enough, leaving some testing points non-contacted, false "opens" are detected, since it is not evident whether the detected "open" is caused by fabrication defect or resulted from unreliable probing.

Therefore, a further advantage of the present invention providing at least two test probes in touch with every element on the WUT, is by being able to minimize the pressure in order to carry out the test. A pre-check of continuity between probes on the same tested element can indicate whether the applied pressure is enough to ensure reliable contact or not. The pressure can be regulated until reliable contact is ensured.

Floating Elements Testing: Existence of floating elements defined as a "single element node (or, net)" can be checked using the multi-probe system of the present invention. This check can not be performed by the conventional single probe system.

The aforementioned tests can be applied as trivial go/nogo tests. The improved efficiency of the present invention becomes critically important when a longer test is required. For example, in order to measure impedance, a relatively long testing time is necessary, and therefore improved efficiency translates into a great reduction in the duration of testing.

All in all, it can be readily appreciated that the automatic test equipment of the present invention renders a number of important advantages over conventional automatic test equipment. These advantages include close proximity of the switching function to the objects under test, a fixtureless system, a miniaturization of parts such that power usage and heat build-up can be greatly reduced, a far greater probe density, a superior signal-to-noise ratio, a wireless in-place switching facility, and others.

Two major benefits of the present invention are:
a. Achieving a high density of micronic test probes guaranteeing simultaneous access of at least two test probes to each and every element on both surfaces of a tested workpiece placed in a random orientation for test, while eliminating the need for pre-test registration, alignment, or any kind of secure means.
b. Using an apparatus as taught by the teachings of the present invention, novel test and measurement methods can be applied, promising greater efficiency and reliability.

It will be appreciated that the above descriptions are intended only to serve as examples, and that many other embodiments are possible within the spirit and the scope of the present invention.

What is claimed is:

1. A test equipment including at least one test area for testing the functionality of a workpiece placed in an arbitrary position and orientation on the test area, for contacting conductive elements of said workpiece, regardless of pitch and configurations of the conductive elements of the workpiece, the test area comprising:
   (a) a base plate;
   (b) at least one test module mounted on said base plate, said test module having compressible means on a surface facing said base plate, such that when mounting said test module on said test plate, said compressible means lies between said test module and said base plate, said test module including:
      (1) at least one semiconductor die, said die including integrated electronic circuitry including an array of selectable memorized switching cells, each said switching cell terminated by a conductive terminal pad, said conductive terminal pad functioning as an input/output contact, said terminal pads matrixed on a surface of said semiconductor die, such die having said electronic circuitry integrated in the remainder area unoccupied by said pads, said terminal pads having bumps of conductive material at ends of said terminal pads;
      (2) a plurality of conductors for use as test electrodes, arrayed in a parallel manner such as to produce a 3-dimensional multi-electrode adapter/pitch translator, having first and second conductive cross-section surfaces, first ends of said electrodes on first surface of said adapter/pitch translator being matrixed and pitched to correspond to said bumped terminal pads of said semiconductor die, second ends of said electrodes on said second surface of said adapter/pitch translator being pitched and matrixed such as to guarantee that each conductive element of the workpiece will be contacted by at least one test electrode for any arbitrary positioning angle of the workpiece on the test area; and, (3) said bumped semiconductor die, being flipped and permanently mounted on a corresponding conductive cross-section surface of said adapter/pitch translator such that each bumped pad of said die is in direct contact with a corresponding test electrode of said adapter/pitch translator, whereby each test electrode is connected to a selectable memorized switching cell of the semiconductor die.

2. The test equipment of claim 1, said second ends of said test electrodes facing said workpiece further comprising bumps of compressible conductive polymer material.

3. The test equipment of claim 1, further comprising a compressible non-conductive cushion filled with micronic conductive particles, said cushion placed on said second cross section surface of said adapter/pitch translator facing the workpiece, said cushion having bumps on said second surface facing the workpiece, said bumps having density and pitch corresponding to density and pitch of said second cross section surface of adapter/pitch translator facing said cushion, such that each test electrode is connected to a respective conductive test bump by a few conductive particles of said cushion, compressibility of said cushion assisting said test bumps to gently tolerate fine variations in heights of said contacted conductive elements on the workpiece.

4. The test equipment of claim 1, wherein said bumps of the test area touching the workpiece are formed by precise printing process.

5. The test equipment of claim 1, wherein said bumps of the test area touching the workpiece are formed by laser etching process.

6. The test equipment of claim 1, wherein density and pitch of test electrodes at surface facing the workpiece is scaled such as to provide a continuous uniform mattress of test electrodes through design of new adapter/pitch translator's, thereby providing for universal usage in accordance with technological advancements needs.

7. The test equipment of claim 1, said test module comprising a plurality of semiconductor dies, each semiconductor die having a controlled powering device for autonomous ON/OFF activation and functioning for test, such that different combinations of semiconductor dies belonging to different test modules can be selected according to test needs, leaving the not relevant remaining test modules unactivated.

8. The test equipment of claim 1, said test module further comprising a shielding cover bracketing said plurality of semiconductor dies mounted on said adapter/pitch translator, outer surface of said shielding cover facing said base plate having said compressible means between the outer surface of said cover and said base plate.

9. A test equipment as in claim 1, the test area comprising a plurality of said test modules mounted on said base plate having compressible means between each said test module and said base plate, such that when pressing said test plate with said modules toward the workpiece, said compressible means of each said test module are individually compressed, allowing each said module to accommodate variations in height of each corresponding section of the workpiece.

10. The test equipment as in claim 1, further comprising a second congruent test area, substantially parallel to the test area, the test equipment for simultaneous functionality testing of both surfaces of a workpiece placed in an arbitrary position and orientation with respect to the test area and said second test area, for contacting the conductive elements of the workpiece, regardless of pitch and configurations of the conductive elements of the workpiece.

11. The test equipment of claim 10, wherein said test electrodes have a density such as to guarantee that each conductive element on both surfaces of the workpiece will be contacted for any arbitrary position and orientation of the workpiece on the test area, thereby eliminating the need for setup preparations such as modification of the test area, fixturing, mechanical adjustments, alignment, and registration, of the workpiece.

12. A test equipment as in claim 1, wherein said test electrodes of said adapter/pitch translator are pitched and matrixed such as to guarantee that each conductive element of the workpiece will be contacted by at least two said test electrodes for any arbitrary position and orientation of the workpiece on the test area.

13. A test equipment as in claim 12, guaranteeing two said test electrodes contacting each conductive element on the workpiece, further comprising guaranteeing a third test electrode contacting conductive element, whereby enabling precise measurements of impedance and resistance of that section of said element between said at least two said electrodes and said third test electrode.

14. A test equipment as in claim 12, wherein, for a workpiece including a floating conductive element on the workpiece, said at least two said electrodes contact said floating conductive element on the workpiece, whereby enabling location verification of said floating conductive element, said location verification including closing a test circuit connected between said at two said electrodes.

15. A test equipment as in claim 12, further comprising an electrical test circuit for connection to said at least two said test electrodes contacting said conductive element on the workpiece, whereby enabling verification of contact reliability, thereby enabling elimination of false detection of open-circuited elements.

16. The test equipment of claim 1, the workpiece including multi-element nets having multiple conductive elements, wherein said switching cells are structured such as to enable a test signal to enter through one conductive element of a multi-element net on the workpiece, as input to the workpiece, said test signal conducted simultaneously through remaining conductive elements of the net as outputs, to a multi-line data-out-buss leading to a central control unit, thereby enabling a one-shot reporting of continuity status between said input conductive element of said net as input, and said remaining conductive elements of the net as parallel outputs.

17. A test equipment as in claim 1, the workpiece including multi-element nets having multiple conductive elements, wherein said switching cells are structured such to enable simultaneously testing more than one multi-element net, including a test signal entering simultaneously through different conductive elements of different nets on the workpiece, as inputs, being conducted out through the remaining conductive elements of the respective net, as independent outputs, to a multi-line data-out-buss leading to a central control unit, thereby enabling a one-shot reporting of continuity status between each of said input conductive elements of said nets and the respective remaining conductive elements of said nets as independent groups of parallel outputs.

18. A test equipment as in claim 1, said switching cells structured such to enable simultaneous testing multi-duplicates of an electronic circuit printed in step-and-repeat manner on the workpiece, wherein, for each said duplicate electronic circuit, a test signal entering simultaneously through different conductive elements of different nets on the workpiece as inputs, can be conducted through the remaining conductive elements of the respective net, as independent outputs, to a multi-line data-out-buss leading to a central control unit, thereby enabling a one-shot reporting of continuity status between each of the input conductive elements of said nets and the respective remaining conductive elements of said nets as independent groups of parallel outputs.

19. A test equipment as in claim 1, the test module further comprising the capability of probing conductive filaments extending from a package of a component mounted on the workpiece, thereby enabling in-circuit testing of the functionality of said component.

20. A test equipment as in claim 1, said semiconductor die further comprising an in-circuit ON/OFF powering device.

21. A test equipment as in claim 1, wherein said adapter/pitch translator includes metallic sheets shaped as comb-teeth, said metallic sheets insulated by non-conductive material.

* * * * *